United States Patent
Schäfertöns

(10) Patent No.: US 11,184,979 B2
(45) Date of Patent: Nov. 23, 2021

(54) PRINTED CIRCUIT BOARD ASSEMBLY

(71) Applicant: Phoenix Contact GmbH & Co. KG, Blomberg (DE)

(72) Inventor: Werner Schäfertöns, Lemgo (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 17/045,603

(22) PCT Filed: Apr. 5, 2019

(86) PCT No.: PCT/EP2019/058724
§ 371 (c)(1),
(2) Date: Oct. 6, 2020

(87) PCT Pub. No.: WO2019/197300
PCT Pub. Date: Oct. 17, 2019

(65) Prior Publication Data
US 2021/0100102 A1    Apr. 1, 2021

(30) Foreign Application Priority Data
Apr. 11, 2018   (BE) .................................. 2018/5245

(51) Int. Cl.
*H05K 1/14* (2006.01)
*H01R 12/52* (2011.01)
*H05K 3/36* (2006.01)

(52) U.S. Cl.
CPC ........... *H05K 1/144* (2013.01); *H01R 12/523* (2013.01); *H05K 1/145* (2013.01); *H05K 3/368* (2013.01);
(Continued)

(58) Field of Classification Search
CPC ........ H05K 1/144; H05K 1/145; H05K 3/368; H05K 2201/041; H05K 2201/09036;
(Continued)

(56) References Cited

U.S. PATENT DOCUMENTS 3,097,032 A * 7/1963 Hochheiser .......... H01R 12/523
439/75
5,613,033 A * 3/1997 Swamy ............. H01L 23/49827
361/790
(Continued)

FOREIGN PATENT DOCUMENTS

CN       1722931 A      1/2006
CN       1996670 A      7/2007
(Continued)

*Primary Examiner* — Hoa C Nguyen
(74) *Attorney, Agent, or Firm* — Holland & Hart LLP

(57) ABSTRACT

A printed circuit board assembly has a first printed circuit board with first and second surfaces, a plurality of electrical contact pins which pass through the first printed circuit board, wherein first ends of the contact pins are electrically contacted on the second surface by soldered elevations, and with first electrical contacts which are arranged on the second surface; and a second printed circuit board with first and second surfaces in which a plurality of blind holes are formed for receiving the first ends of the contact pins, wherein the second printed circuit board has second electrical contacts on the second surface, and the second surfaces of the first printed circuit board and the second printed circuit board are joined together such that the contact pins reach into the blind holes such that the first electrical contacts electrically contact the second electrical contacts.

15 Claims, 2 Drawing Sheets

(52) U.S. Cl.
CPC .................. *H05K 2201/041* (2013.01); *H05K 2201/09036* (2013.01); *H05K 2201/10303* (2013.01); *H05K 2201/10318* (2013.01)

(58) Field of Classification Search
CPC .......... H05K 2201/10303; H05K 2201/10318; H01R 12/523
See application file for complete search history.

(56) References Cited

U.S. PATENT DOCUMENTS

| | | | | |
|---|---|---|---|---|
| 5,734,555 A * | 3/1998 | McMahon | ........... | H05K 1/0204 257/686 |
| 5,878,483 A * | 3/1999 | Kman | ................... | H01R 12/523 29/739 |
| 5,883,782 A * | 3/1999 | Thurston | ............. | H01L 23/4006 361/704 |
| 6,304,450 B1 * | 10/2001 | Dibene, II | ................ | G06F 1/18 165/185 |
| 6,381,136 B1 * | 4/2002 | Nelson | ..................... | H05K 7/20 361/704 |
| 6,457,982 B1 * | 10/2002 | Ko | ..................... | H01R 13/6485 439/946 |
| 6,817,870 B1 * | 11/2004 | Kwong | ................ | H01R 12/523 439/74 |
| 6,982,876 B1 * | 1/2006 | Young | .................... | H05K 1/141 361/719 |
| 7,298,622 B2 * | 11/2007 | Conner | ................ | H01L 23/4006 257/E23.084 |
| 2006/0166526 A1 * | 7/2006 | Lee | ...................... | H01R 12/523 439/75 |
| 2016/0278209 A1 * | 9/2016 | Perez-Uria | ............. | H01R 12/58 |
| 2017/0271799 A1 | 9/2017 | Axelowitz et al. | | |

FOREIGN PATENT DOCUMENTS

| | | |
|---|---|---|
| CN | 202855947 U | 4/2013 |
| CN | 107369933 A | 11/2017 |
| DE | 699 29 144 T2 | 7/2006 |
| WO | WO 95/06344 A1 | 3/1995 |

* cited by examiner

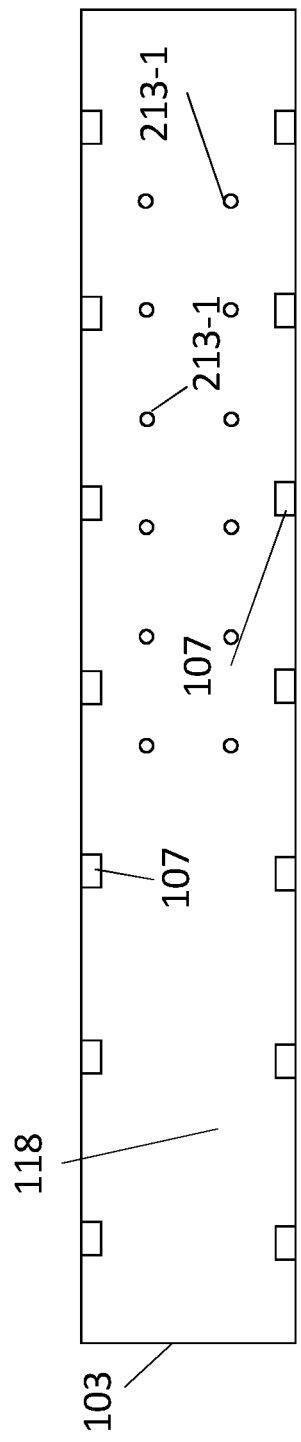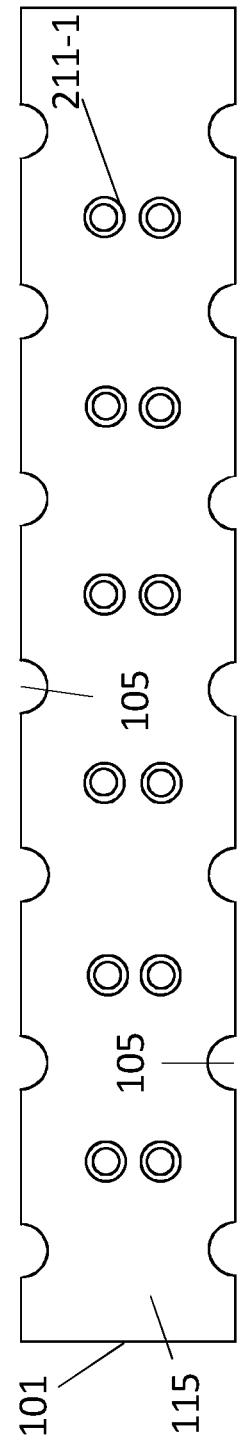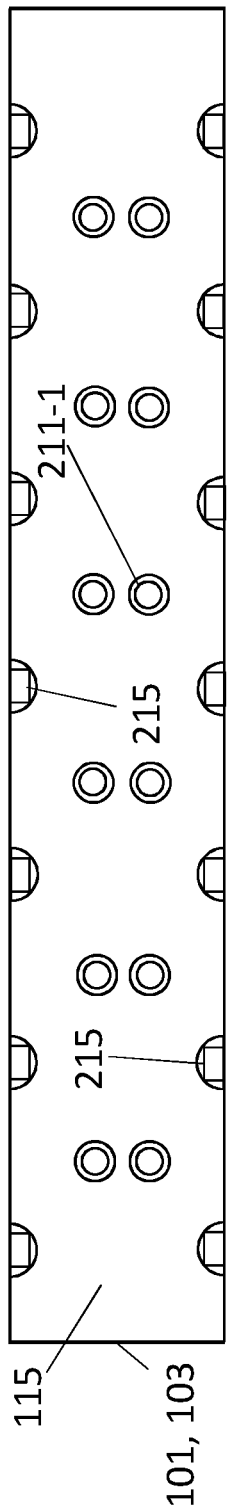

PRINTED CIRCUIT BOARD ASSEMBLY

CROSS-REFERENCE TO RELATED APPLICATIONS

The present application is the national phase entry under 35 U.S.C. 371 of International Patent Application No. PCT/EP2019/058724 by Schäfertöns, entitled "PRINTED CIRCUIT BOARD ASSEMBLY," filed Apr. 5, 2019; and claims the benefit of Belgium Patent Application No. BE2018/5245 by Schäfertöns, entitled "LEITERPLATTENANORDNUNG," filed Apr. 11, 2018, each of which is assigned to the assignee hereof and is incorporated by reference in its entirety.

BACKGROUND

The present disclosure relates to an assembly of printed circuit boards, in particular an assembly of printed circuit boards which enables the printed circuit boards to be electrically connected.

A large number of printed circuit boards equipped with different components are usually installed in electrical devices. The problem often arises here of installing the various printed circuit boards as securely as possible inside the device and thereby arranging them as space-saving as possible. Depending on the design of the printed circuit boards and the space available inside the electrical device, it is often advantageous in this context to arrange the circuit boards in a vertical, plane-parallel assembly in the form of stacking the individual printed circuit boards. This is usually done using sandwich bars. In this context, sandwich bars offer the advantage that the printed circuit boards to be installed can be structurally connected to one another via the sandwich bar and thus a structurally secure assembly of the printed circuit boards can be achieved. In addition, the sandwich strip also offers an electrical connection between the printed circuit boards arranged with respect to one another, so that an additional electrical connection between the printed circuit boards connected by means of the sandwich bars can be dispensed. Sandwich bars are known in the prior art and are usually formed from a plurality of electrical contact pins which are arranged in single or double rows above an electrically insulating base body and have electrical contacts above and below the base body for connection to the respective printed circuit boards. Via the rigid structure of the contact pins, the sandwich bar is able to provide not only an electrical connection between the printed circuit boards to be arranged but also a structurally secure assembly of the printed circuit boards, which firmly connects the printed circuit boards to one another. A disadvantage of conventional sandwich bars, however, is the increased spatial requirement, which arises from the fact that the base body of the sandwich strip arranged between the printed circuit boards does not allow the circuit boards to be arranged as close to one another as desired.

SUMMARY

It is therefore the object of the present disclosure to provide an improved assembly for the electrical connection of printed circuit boards.

This object is achieved by the features of the independent claims. Advantageous examples of the principles of the present disclosure are the subject matter of the dependent claims, the description and the accompanying figures.

The disclosure is based on the knowledge that the above object is achieved by an assembly for the electrical connection of printed circuit boards which provides for electrically connecting two printed circuit boards to one another by means of a soldered connection.

According to one aspect of the present disclosure, the printed circuit board assembly comprises:

a first printed circuit board with a first surface and a second surface facing away from the first surface, a plurality of first electrical connections and a plurality of electrical contact pins, which are received by a plurality of first electrical connections and pass through the first printed circuit board, wherein first ends of the contact pins are electrically contacted on the second surface by soldered elevations, and with first electrical contacts which are arranged on the second surface; and a second printed circuit board, with a first surface and a second surface facing away from the first surface, wherein a plurality of blind holes for receiving the first ends of the contact pins is formed in the second surface, and wherein the second printed circuit board has second electrical contacts on the second surface;

wherein the first printed circuit board and the second printed circuit board are brought together with their second surfaces in such a way that the first ends of the contact pins extend into the blind holes, and that the first electrical contacts make electrical contact with the second electrical contacts.

The printed circuit board assembly according to the present disclosure provides a vertical assembly of two circuit boards. For this purpose, the printed circuit board assembly comprises a first printed circuit board and a second printed circuit board, which each have a first surface and a second surface and are suitable for being equipped with a large number of components. The components that are to be arranged on the first and second printed circuit boards, in particular a plurality of contact pins, are each arranged on the first surfaces of the first and second printed circuit boards.

The contact pins of the plurality of contact pins which are arranged on the first printed circuit board and are electrically connected to it, pass through the first printed circuit board in such a way that first ends of the contact pins protrude beyond the second surface of the first printed circuit board, and are electrically connected to the first printed circuit board via soldered elevations.

To electrically connect the first and second printed circuit boards to one another, the first and second printed circuit boards have first and second electrical contacts, the first electrical contacts being formed exclusively on the second surface of the first printed circuit board and the second electrical contacts being formed exclusively on the second surface of the second printed circuit board.

The printed circuit board assembly is implemented in that the first and second printed circuit boards are each brought together with their second surfaces until electrical contacting of the first electrical contacts of the first printed circuit board with the second electrical contacts of the second printed circuit board can be established. For this purpose, the first and second printed circuit boards are preferably guided so close to one another that contact between the two second surfaces of the first and second printed circuit boards is achieved.

The second printed circuit board also has a plurality of blind holes on its second surface which receive the first ends of the contact pins which extend through the first printed circuit board and protrude beyond the second surface of the first printed circuit board, so that when the first and second printed circuit boards are assembled into the printed circuit board assembly according to the present disclosure a contact of the second surfaces of the first and second printed circuit boards can be realized.

An electrical connection between the first and second printed circuit boards is established via the contact between the first electrical contacts of the first printed circuit board and the second electrical contacts of the second printed circuit board.

Since the first ends of the contact pins extending through the first printed circuit board, which protrude on the second surface of the first printed circuit board, are received by the blind holes formed on the second surface of the second printed circuit board, a printed circuit board assembly is achieved which minimize preferably completely eliminate an unused space between the two arranged circuit boards, so that a printed circuit board assembly can be realized which has a minimal vertical extent. In this connection, the vertical direction is the normal direction of the first and second surfaces of the first and second printed circuit boards when these are arranged horizontally and plane-parallel to one another.

According to one example, the first electrical contacts are electrically permanently connected to the second electrical contacts, in particular soldered.

According to the present disclosure, the electrical connection between the first electrical contacts of the first printed circuit board and the second electrical contacts of the second printed circuit board is a fixed electrical connection which cannot easily be released even by an external force acting on the first and second printed circuit boards. The fixed electrical connection between the first and second electrical contacts is preferably a soldered connection. The soldered connection ensures structural strength of the connection of the first and second electrical contacts and ensures an efficient electrical connection between the first and second printed circuit boards. The production of the soldered connection, that is to say the soldered process, can also be carried out by a machine, so that the implementation of the electrical connection of the first and second printed circuit boards can be integrated into the production process of the printed circuit board assembly in a problem-free and time-saving manner.

According to one example, the soldered connections between the first electrical contacts and the second electrical contacts provide an electrical connection and a structural connection of the first and second printed circuit boards.

According to the present disclosure, the soldered points on the first and second electrical contacts of the first and second printed circuit boards not only serve to electrically connect the first and second printed circuit boards, but also provide a structural connection between the first and second printed circuit boards and ensure that the first and second printed circuit boards are firmly fixed together. This makes it possible to avoid the use of additional structural connecting means which would otherwise be required for a structural connection of the first and second printed circuit boards. This in turn not only simplifies the manufacturing process of the circuit board assembly, in that the electrical and structural connection of the first and second printed circuit boards can be affected in one work step with the application of the soldered points to the first and second electrical contacts. Instead, a more space-efficient design of the printed circuit board assembly is also possible, since no separate structural connecting means have to be attached to the printed circuit boards and the surfaces of the printed circuit boards can consequently be used more efficiently for equipping with components. Furthermore, the soldered points take up very little space on the circuit board, since they are in particular formed with a comparatively small thickness or thickness, which additionally enables a small vertical expansion of the printed circuit board assembly to be achieved according to the present disclosure.

According to one example, the first electrical contacts are formed as contact recesses, in particular solder cups, which are suitable for receiving a solder.

The first electrical contacts, formed as contact recesses or solder cups, are suitable for receiving a substantial amount of solder and making it available for the soldered points. The substantial amount of solder that is thus available for each individual soldered point through the first electrical contacts makes it as robust as possible and efficient electrical connection of the first and second printed circuit boards can be achieved. Furthermore, a structural strength of the structural connection of the first and second printed circuit boards provided by the soldered points can be achieved in this way, which structural strength can withstand the mechanical stresses of the circuit board assembly. The use of additional structural connecting means can consequently be dispensed with and the structural connection of the first and second printed circuit boards can be affected exclusively by the soldered points on the first and second electrical contacts. The first electrical contacts are preferably made of electrically conductive material, particularly preferably made of a metallic material.

According to one example, the second electrical contacts are formed as contact surfaces, in particular soldered pads, to which a solder can be applied.

By forming the second electrical contacts as contact areas, in particular soldered pads, it is achieved that the second electrical contacts can establish an electrical connection with the solder received by the first electrical contacts and provided for connection. The second electrical contacts are preferably formed from electrically conductive material, particularly preferably from a metallic material.

According to one example, the first electrical contacts and the second electrical contacts can be electrically connected by bringing the second surfaces of the first printed circuit board and the second printed circuit board together.

By bringing together the second surfaces of the first and second printed circuit boards, the second electrical contacts adapted as contact areas can dip into the solder provided by the first electrical contacts adapted as contact recesses and thus provide a robust electrical and strong structural connection between the first and second printed circuit boards. By adapting the first electrical contacts as contact recesses and adapting the second electrical contacts as contact surfaces, on the one hand a substantial amount of solder can be used for the connection and, on the other hand, the complete wetting of the first and second contacts with solder enables the largest possible contact surface between the first and second contacts and the solder used for the connection and thus the strongest possible electrical and structural connection of the first and second electrical contacts can be achieved. Furthermore, by combining the contact recess and the contact surface reaching into the contact recess to achieve such a strong connection, a correspondingly thick layer of solder applied to the second surfaces of the first and second printed circuit boards can be avoided, which would cause an undesired gap between the first and second printed circuit boards.

According to one example, the plurality of first electrical connections is formed as a plurality of through bores, in particular a plurality of soldered eyes, and is suitable for receiving and electrically connecting a plurality of components, in particular the contact pins.

An electrical and structural connection of the contact pins to the first printed circuit board can be achieved through the first electrical connections, in that the first electrical connections are adapted to receive the contact pins in such a way that they run through the first printed circuit board, and electrically connect the contact pins also to the first printed circuit board. The first electrical connections are preferably adapted as soldered eyes.

According to a further example, an electrical and structural connection of the contact pins to the second printed circuit board can be achieved through the first electrical contacts.

According to a further example, a connection between the first electrical contacts and the second electrical contacts can be achieved by an electrical and structural connection of the contact pins to the second printed circuit board.

According to one example, the respective position of the plurality of blind holes on the second surface of the second printed circuit board corresponds to the respective position of the plurality of first electrical connections on the second surface of the first printed circuit board.

With a plane-parallel assembly of the second surfaces of the first and second printed circuit boards, the plurality of blind holes formed on the second surface of the second printed circuit board can be oriented congruently with the plurality of first electrical connections formed on the first printed circuit board. This ensures that when the second surfaces of the first and second printed circuit boards are brought together, the first ends of the electrical contact pins protruding beyond the second surface of the first printed circuit board reach into the blind holes and are received by them.

According to one example, the plurality of blind holes is formed from an electrically insulating material.

The formation of the plurality of blind holes in the second surface of the second printed circuit board from an electrically insulating material prevents, when the first ends of the contact pins of the plurality of contact pins of the first printed circuit board are received by the plurality of blind holes, a direct electrical connection of the contact pins of the first printed circuit board with components of the second printed circuit board can take place, which could disrupt and prevent error-free operation of the first and second printed circuit boards.

According to one example, the second printed circuit board has a plurality of second electrical connections which are formed to receive and electrically connect a plurality of components, in particular a pin header for system cabling.

The plurality of second electrical connections is preferably adapted as a plurality of through bores or blind holes, in particular soldered eyes, which are suitable for receiving and electrically connecting the plurality of components, in particular the pin header.

According to a further example, the first electrical contacts are adapted as contact recesses and the second electrical contacts are adapted as contact surfaces and serve to connect the first and second printed circuit boards.

According to one example, the first and second surfaces of the first and second printed circuit boards are the surfaces of the circuit boards which have the largest surface area.

According to the present disclosure, the printed circuit board assembly is implemented by stacking the first and second printed circuit boards. This is further achieved in that when the first and second printed circuit boards are stacked on top of one another, these are each oriented with their second surfaces facing one another. This has the effect that an assembly of the circuit boards that is as space-saving as possible can be achieved in that the second surfaces of the first and second printed circuit boards are brought together as close as possible, preferably resting on one another. The printed circuit board assembly according to the present disclosure is thus implemented as a space-saving vertical assembly of the first and second printed circuit boards.

According to one example, the first electrical contacts of the first printed circuit board and the second electrical contacts of the second printed circuit board are arranged congruently to one another.

Preferably, the first and second printed circuit boards have an identical number of first and second electrical contacts, which are each formed on the first and second printed circuit boards at mutually corresponding locations, so that the first and second electrical contacts by joining the two second surfaces of the first and second printed circuit boards can be arranged exactly one above the other. This ensures that the strongest possible connection is achieved through the highest possible degree of coverage of the first and second electrical contacts to one another, in that the congruent assembly maximizes the contact area between the first and second contacts and the solder used for the connection.

According to one example, the first electrical contacts are formed on the edge of the second surface of the first printed circuit board and the second electrical contacts are formed on the edge of the second surface of the second printed circuit board.

The formation of the first and second electrical contacts on the edges of the first and second printed circuit boards, on the one hand, simplifies the soldered process or the application of the solder points to the first and second electrical contacts, since the first and second electrical contacts formed on the edges of the circuit boards compared to contacts formed inside the surface of the first and second printed circuit boards mean a simplified access. Furthermore, by forming the first and second electrical contacts at the edges of the first and second printed circuit boards it is achieved that the surface inside of the circuit boards can be used exclusively for equipping with electronic components, in particular the contact pins and the pin header, which in turn contributes to a space-efficient solution of the printed circuit board assembly according to the present disclosure.

According to one example, the first printed circuit board and the second printed circuit board are brought together for electrical connection in such a way that the second surfaces of the first and second printed circuit boards lie on top of each another.

According to the present disclosure, the printed circuit board assembly of the present disclosure represents a vertical assembly of the first and second printed circuit boards with the smallest possible vertical extension. By joining the second surfaces of the first and second printed circuit boards until the first and second printed circuit boards are in contact, an unused intermediate space between the first and second printed circuit board can be avoided and consequently an assembly of the first and second printed circuit boards can be achieved with minimal vertical extension.

According to one example, the first printed circuit board and the second printed circuit board are arranged congruently with one another.

The first and second printed circuit boards advantageously have identical dimensions. In this way, on the one hand, production is simplified, since identical components can be used, and, on the other hand, the printed circuit board assembly according to the present disclosure can also be produced in the horizontal direction with minimal expansion.

According to one example, the contact pins are electrically connected to the first printed circuit board and the pin header is connected to the second printed circuit board by soldered connections.

According to one example, the vertical dimensions of the assembly are determined by the thickness of the first and second printed circuit boards.

By bringing the second surfaces of the first and second printed circuit boards together for the electrical and structural connection through the soldered points on the first and second electrical contacts and for realizing a circuit board assembly, it is preferably achieved that the second surfaces of the first and second printed circuit boards rest on one another and thus creating a gap between the first and second printed circuit boards is avoided. The vertical extent of the printed circuit board assembly is thus primarily dependent on the vertical extent of the respective first and second printed circuit boards, with the components installed on the first and second printed circuit boards and their vertical dimensions not being added to the vertical extent of the circuit board assembly. The printed circuit board assembly according to the present disclosure thus enables a space-efficient assembly of circuit boards, especially in the vertical direction, compared to conventional circuit board arrangements which are implemented, for example, via sandwich strips known from the prior art.

BRIEF DESCRIPTION OF THE DRAWINGS

Further examples are explained with reference to the accompanying figures. They show:

FIG. 2A shows a schematic plan view of a second printed circuit board of a printed circuit board assembly according to an example of the principles of the present disclosure;

FIG. 2B shows a schematic plan view of a first printed circuit board of a printed circuit board assembly according to an example of the principles of the present disclosure; and FIG. 2C shows a schematic plan view of a printed circuit board assembly according to an example of the principles of the present disclosure; wherein the first printed circuit board is resting on the second printed circuit board, and wherein the first and second printed circuit boards are electrically connected to one another via soldering on the contact recesses of the first printed circuit board and the contact surfaces of the second printed circuit board.

DETAILED DESCRIPTION

Figure 1:
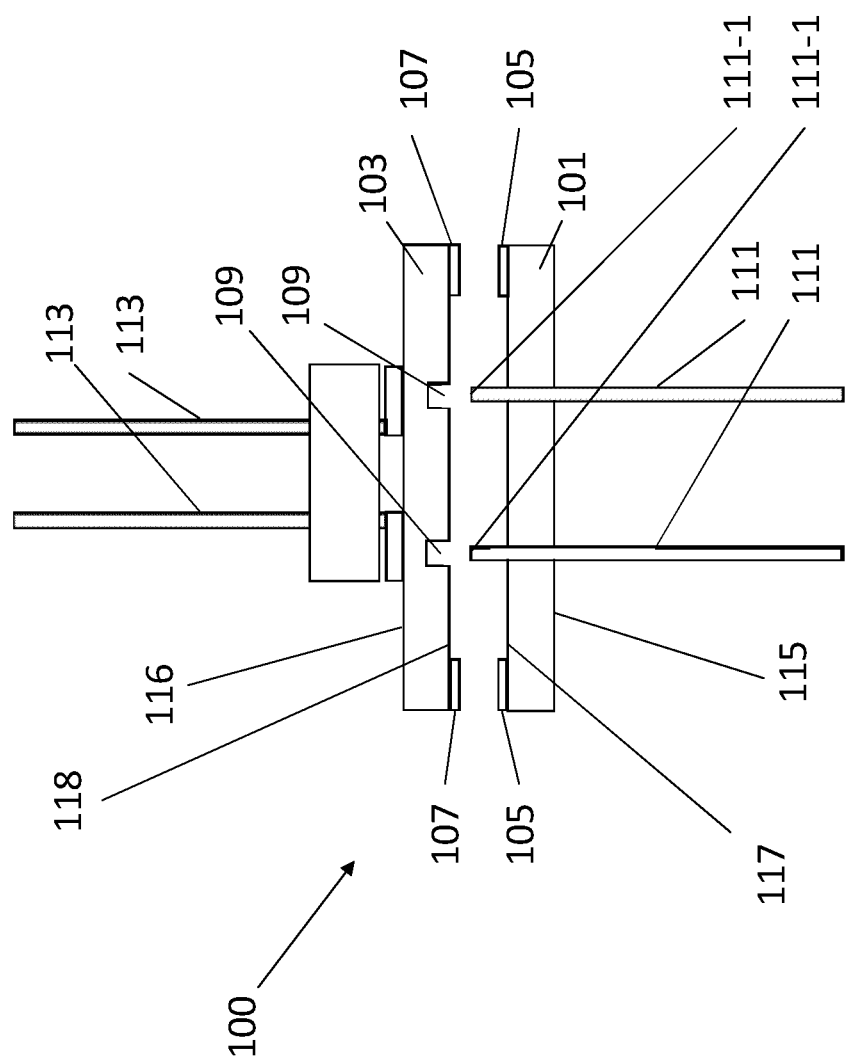
FIG. 1 shows a schematic side view of a printed circuit board assembly according to an example of the principles of the present disclosure.

According to FIG. 1, a printed circuit board assembly 100 according to a preferred exemplary embodiment of the present disclosure comprises a first printed circuit board 101 with a first surface 115 and a second surface 117 and a second printed circuit board 103 with a first surface 116 and a second surface 118.

The first printed circuit board 101 further comprises first electrical contacts 105, which are formed on the second surface 117 of the first printed circuit board 101. The first electrical contacts 105 are preferably formed on the edge of the second surface 117 of the first printed circuit board 101. The first printed circuit board 101 additionally comprises a plurality of contact pins 111, which run through the first printed circuit board 101. The contact pins 111 in turn have first ends 111-1, wherein the contact pins 111 extend through the first printed circuit board 101 in such a way that the first ends 111-1 of the contact pins 111 protrude beyond the second surface 117 of the first printed circuit board 101.

The second printed circuit board 103 comprises a pin header 113, which is formed on the first surface 116 of the second printed circuit board 103 and is electrically connected to it. The second printed circuit board 103 also has a plurality of blind holes 109 which are formed on the second surface 118 of the second printed circuit board 103. The position of the plurality of blind holes 109 on the second surface 118 of the second printed circuit board 103 corresponds to the position of the plurality of first ends 111-1 of the plurality of contact pins 111 on the second surface 117 of the first printed circuit board 101. In addition, the second printed circuit board 103 has a plurality of second electrical contacts 107, which is formed on the second surface 118 of the second printed circuit board 103. As shown in FIG. 1, the position of the second electrical contacts 107 on the second surface 118 of the second printed circuit board 103 corresponds to the position of the first electrical contacts 105 on the second surface 117 of the first printed circuit board 101.

The first electrical contacts 105 are preferably configured as contact recesses in the first printed circuit board 101, in particular as solder cups. For illustrative reasons, the first electrical contacts 105 are only shown schematically in FIG. 1, so that the configuration of the first electrical contacts as contact recesses or solder cups is not explicitly illustrated.

FIG. 1 shows the printed circuit board assembly according to the present disclosure in a disconnected state. To connect the first and second printed circuit boards 101, 103, the first printed circuit board 101 and the second printed circuit board 103 are brought together with their second surfaces 117, 118, so that electrical contacting of the first electrical contacts 105 of the first printed circuit board 101 with the second electrical contacts 107 of the second printed circuit board 103 is enabled. When the two second surfaces 117, 118 of the first and second printed circuit boards 101, 103 are brought together, the first ends 111-1 of the contact pins 111 extending through the first printed circuit board 101 protruding from the second surface 117 of the first printed circuit board 101 extend into the blind holes 109 formed on the second surface 118 of the second printed circuit board 103 and are received by them. This enables the two second surfaces 117, 118 of the first and second printed circuit boards 101, 103 to come closer together. The first and second printed circuit boards 101, 103 are preferably brought together so closely that the two second surfaces 117, 118 of the first and second printed circuit boards 101, 103 rest completely on one another.

The electrical connection of the first electrical contacts 105 of the first printed circuit board 101 to the second electrical contacts 107 of the second printed circuit board 103 is preferably implemented via a soldered connection. The solder can be absorbed through the first electrical contacts 105 of the first printed circuit board 101, which are formed as contact recesses or solder cups, so that the immersion of the second electrical contacts 107 of the second printed circuit board 103, which are formed as contact areas or soldered pads, into the solder received from the first electrical contacts 105 so that a powerful electrical connection between the first and second electrical contacts 105, 107 can be established. The substantial amount of solder that is used for each soldered connection between first and second electrical contacts 105, 107 also allows for a substantial structural strength of the respective soldered connections to be achieved, so that the soldered connections of the first and second electrical contacts 105, 107 in addition to the electrical connection of the first and second printed circuit boards 101, 103 also provide a structural connection of the first and second printed circuit boards 101, 103. Additional structural connecting means, which could contribute to a structural connection of the first and second printed circuit boards 101, 103, can be dispensed with in a printed circuit board assembly according to the present disclosure.

FIG. 2A is a schematic top view of the second printed circuit board 103 according to an exemplary embodiment of the present disclosure, wherein the second surface 118 of the second printed circuit board 103 is shown in the present case. The second printed circuit board 103 is formed as a narrow, elongated, rectangular plate and has a plurality of second electrical contacts 107 and a plurality of second electrical connections 213-1. However, a different rectangular shape of the first printed circuit board 101 than the one shown is also possible. The plurality of blind holes 109 is not shown in FIG. 2A.

The second electrical contacts 107 are formed on the second surface 118 as contact areas or soldered pads and are each arranged on the two opposite edges of the longitudinal sides of the second printed circuit board 103. The second electrical contacts 107 are presently shown as rectangular contact areas. Another shape for the second electrical contacts 107 is also possible. The plurality of second electrical connections 213-1 is used to equip the circuit board, i.e. to accommodate and electrically connect components, in particular the pin header 113, to the second printed circuit board 103. The second electrical connections 213-1 can be adapted through bores, blind holes or other connections, which make it possible to arrange a plurality of electronic components on the second printed circuit board 103 and to connect them electrically. The second electrical contacts 213-1 are preferably formed as soldered eyes. In FIG. 2A, the second electrical connections 213-1 are shown as a double row of connections, which is suitable for fastening the pin header 113 to the second printed circuit board 103 and for electrically connecting it. However, a different assembly of the second electrical connections 213-1 on the second printed circuit board 103 is also possible.

FIG. 2B is a schematic top view of the first printed circuit board 101 according to an exemplary embodiment of the present disclosure, wherein the first surface 115 of the first printed circuit board 101 is shown in the present case. The first printed circuit board 101, like the second printed circuit board 103, is formed as a narrow, elongated, rectangular plate and has a plurality of first electrical contacts 105 and a plurality of first electrical connections 211-1. However, a different rectangular shape of the first printed circuit board 101 than the one shown is also possible.

The first electrical contacts 105 are formed as contact recesses and are arranged on the edges of the two opposite longitudinal sides of the first printed circuit board 101. The semicircular design of the contact recesses of the first electrical contacts 105 in FIG. 2A is only due to illustrative reasons and is not intended to restrict the shape of the first electrical contacts 105 to the shape shown in FIGS. 2B and 2C. Further configurations of the first electrical contacts 105 that differ from those shown are also possible. The first electrical contacts 105 are formed with a metallic material in such a way that an electrical contact with the second electrical contacts 107 of the second printed circuit board 103 is made possible via a soldered connection. The first electrical contacts 105 of the first printed circuit board 101 are each formed on the edges of the longitudinal sides of the first printed circuit board 101 in such a way that the positions of the first electrical contacts 105 correspond to the positions of the second electrical contacts 107 on the second printed circuit board 103.

The first printed circuit board 101 also has a plurality of first electrical connections 211-1, which in FIG. 2B are formed as a double row of connections arranged in the center of the first printed circuit board 101. Another assembly, which corresponds to the respective requirements of other components to be arranged on the first printed circuit board 101, is also possible. The first electrical connections 211-1 are formed as through bores, provided with a metallic material and suitable for receiving the contact pins 111 and electrically connecting them. The first electrical connections 211-1 are preferably formed as soldered eyes.

FIG. 2C shows the first and second printed circuit boards 101, 103 of the printed circuit board assembly 100 according to the present disclosure in a connected state. For this purpose, the first printed circuit board 101 and the second printed circuit board 103 are joined together with their second surfaces 117, 118, so that, as shown in FIG. 2C, the first printed circuit board 101 rests on the second printed circuit board 103. As shown in FIG. 2C, the first and second printed circuit boards 101, 103 are stacked on top of one another in such a way that the first and second printed circuit boards 101, 103 are brought into congruence. Another assembly is also possible.

The first and second electrical contacts 105, 107 of the first and second printed circuit boards 101, 103 are completely congruent in FIG. 2C, wherein a different assembly of the first and second electrical contacts 105, 107 is also possible. The complete coverage of the first and second electrical contacts 105, 107 enables the most extensive possible application of solder to the first and second electrical contacts 105, 107, so that the soldered points 215 formed on the contacts ensure the most powerful electrical and robust structural connection between the first and second electrical contacts 105, 107 and thus the first and second printed circuit boards 101, 103 can be effected.

LIST OF REFERENCE SYMBOLS 100 printed circuit board assembly
101 first printed circuit board
103 second printed circuit board
105 first electrical contact
107 second electrical contact
109 blind hole
111 contact pin
111-1 first end
113 pin header
115 first surface
116 first surface
117 second surface
118 second surface
211-1 first electrical connection
213-1 second electrical connection
215 solder joint

What is claimed is:
1. A printed circuit board assembly, comprising:
a first printed circuit board comprising a first surface and a second surface facing away from the first surface, a plurality of electrical contact pins which are received by a plurality of first electrical connections and pass through the first printed circuit board, wherein first ends of the contact pins are electrically contacted on the second surface by soldered elevations and with first electrical contacts which are arranged on the second surface and a second printed circuit board with a first surface and a second surface facing away from the first surface wherein in the second surface a plurality of blind holes configured to receive the first ends of the contact pins is formed, and wherein the second printed circuit board has second electrical contacts on the second surface;

wherein the first printed circuit board and the second printed circuit board are brought together with their respective second surfaces in such a way that the first ends of the contact pins extend into the blind holes and that the first electrical contacts make electrical contact with the second electrical contacts.

2. The printed circuit board assembly according to claim 1, wherein the first electrical contacts are soldered to the second electrical contacts.

3. The printed circuit board assembly according to claim 2, wherein soldered connections between the first electrical contacts and the second electrical contacts provide an electrical connection and a structural connection of the first and second printed circuit boards.

4. The printed circuit board assembly according to claim 1, wherein the first electrical contacts are formed as solder cups.

5. The printed circuit board assembly according to claim 1, wherein the second electrical contacts are formed as soldered pads.

6. The printed circuit board assembly according to claim 1, wherein the plurality of first electrical connections is formed as a plurality of soldered eyes configured to receive and electrically connect the contact pins.

7. The printed circuit board assembly according to claim 1, wherein a position of the plurality of blind holes on the second surface of the second printed circuit board corresponds to a position of the plurality of first electrical connections on the second surface of the first printed circuit board.

8. The printed circuit board assembly according to claim 1, wherein the plurality of blind holes is formed from an electrically insulating material.

9. The printed circuit board assembly according to claim 1, wherein the second printed circuit board comprises a plurality of second electrical connections which are configured to receive and electrically connect pin header for system cabling.

10. The printed circuit board assembly according to claim 1, wherein the first and second surfaces of the first and second printed circuit boards are the surfaces of the respective printed circuit boards which have a largest surface area.

11. The printed circuit board assembly according to claim 1, wherein the first electrical contacts of the first printed circuit board and the second electrical contacts of the second printed circuit board are arranged congruently to one another.

12. The printed circuit board assembly according to claim 1, wherein the first electrical contacts are formed on an edge of the second surface of the first printed circuit board and the second electrical contacts are formed on an edge of the second surface the second printed circuit board.

13. The printed circuit board assembly according to claim 1, wherein the first printed circuit board and the second printed circuit board are connected such that the respective second surfaces of the first and second printed circuit boards lie on top of each other.

14. The printed circuit board assembly according to claim 1, wherein the first printed circuit board and the second printed circuit board are arranged congruently to one another.

15. The printed circuit board assembly according to claim 1, wherein vertical dimensions of the printed circuit board assembly are determined by a thickness of the first and second printed circuit boards.

* * * * *